United States Patent
Lanan

(10) Patent No.: US 6,646,451 B2
(45) Date of Patent: Nov. 11, 2003

(54) TIME DOMAIN REFLECTOMETER DISPLAY METHOD

(75) Inventor: Keith W. Lanan, Renton, WA (US)

(73) Assignee: Utilx Corporation, Kent, WA (US)

( * ) Notice: Subject to any disclaimer, the term of this patent is extended or adjusted under 35 U.S.C. 154(b) by 0 days.

(21) Appl. No.: 09/732,448

(22) Filed: Dec. 6, 2000

(65) Prior Publication Data

US 2002/0067171 A1 Jun. 6, 2002

Related U.S. Application Data

(60) Provisional application No. 60/169,229, filed on Dec. 6, 1999.

(51) Int. Cl.[7] .................. G01R 27/04; G01R 31/28; G01R 31/11; G01R 13/02; G09G 5/22
(52) U.S. Cl. .................. 324/642; 324/528; 324/534; 702/68; 702/71; 345/440.1
(58) Field of Search ................ 324/642, 534, 324/533, 637, 525, 639, 532, 528, 86, 121 R, 107; 327/100, 106; 702/67, 71, 68, 189, 39; 345/440, 440.1

(56) References Cited

U.S. PATENT DOCUMENTS

| | | | |
|---|---|---|---|
| 3,505,597 A | | 4/1970 | Cronin et al. |
| 3,656,009 A | * | 4/1972 | Chen .................. 327/108 |
| 3,727,128 A | * | 4/1973 | McFerrin .................. 324/533 |
| 4,538,103 A | * | 8/1985 | Cappon .................. 324/534 |
| 4,766,386 A | | 8/1988 | Oliver et al. |
| 4,815,002 A | * | 3/1989 | Verbanets .................. 702/75 |
| 5,128,619 A | | 7/1992 | Bjork et al. |
| 5,243,294 A | | 9/1993 | Burnett |
| 5,410,255 A | * | 4/1995 | Bailey .................. 324/525 |
| 5,461,318 A | | 10/1995 | Borchert et al. |
| 5,481,195 A | | 1/1996 | Meyer |
| 5,719,503 A | | 2/1998 | Burnett |

FOREIGN PATENT DOCUMENTS

EP 0 649 029 A2 4/1995

* cited by examiner

*Primary Examiner*—Anjan K. Deb
(74) *Attorney, Agent, or Firm*—Christensen O'Connor Johnson Kindness PLLC

(57) ABSTRACT

A computer-based method and computer-readable medium containing computer-executable instructions for assimilating data collected by a time domain reflectometer and displaying more than two waves representing reflections of a pulse on conductors is provided. The method includes a means for wave reversal, wave shifting, multi-wave display, segmented velocity of propagation adjustment, multi-cursor option multi-flagging options and calculating of the total length of wet cable. The combination of these functions provides a highly accurate means for identifying the location of splices, faults, corrosion, cable damage and other anomalies that are typically found on any length of conductor cable. The ability of this method to display a greater number of waves simultaneously adds additional benefit to a technician attempting to locate particular anomalies with multi-conductor cables.

34 Claims, 17 Drawing Sheets

TIME DOMAIN REFLECTOMETER DISPLAY METHOD

CROSS-REFERENCE TO RELATED APPLICATION

This application claims the benefit of U.S. Provisional Patent Application No. 60/169,229, filed Dec. 6, 1999, the disclosure of which is hereby expressly incorporated by reference.

FIELD OF THE INVENTION

The present invention relates generally to time domain reflectometers and, more particularly, to a method of minimizing signal errors and anomalies.

BACKGROUND OF THE INVENTION

With the ever-increasing number of communication and transmission cables being utilized throughout the world, it is desirable that anomalies such as faults, partial discharges, cable damage, and splices on communication and power transmission cables be located without the necessity of physical tracing and inspection. A Time Domain Reflectometer (TDR) can be used to analyze a cable for anomalies or changes in cable impedance in order to locate such anomalies. A typical TDR transmits a pulse of electrical energy onto cables that include two conductors separated by a dielectric material. When the pulse encounters a change in the impedance of the cable, part of the pulse's energy is reflected back toward the TDR. The amplitude and polarity of this reflection is proportional to the change in impedance. Such reflections are usually displayed in graphical form on the screen of a typical TDR whereby a technician can interpret the results and locate specific cable anomalies.

In the past, a technician's ability to interpret a displayed waveform has been limited because of a TDR's inability to provide high quality information. Information correlating to the portion of cable located closest to the TDR is of higher quality than that portion of the cable remotely located from the TDR. This is because the reflection signal degrades as the length increases. As a result, a waveform decreases in accuracy as the distance between that portion of the cable being measured and the TDR increases. Currently, there are several available solutions to overcome waveform degradation. One such solution is to locate the TDR at both ends of the cable being analyzed. This is undesirable because the technician would have to manually compare the two waveforms and make a calculation to determine the location of objects of interest, such as the location and determination of anomalies.

Another solution is to connect a signal wire to each end of the cable and simultaneously measure the refection wave. The TDR would then be able to process the two signals to better pinpoint anomalies. This is undesirable because a great length of test leads are necessary to measure two ends of a long portion of cable simultaneously with a single TDR. Additional problems arise when a standard three-phase power cable is analyzed and only one phase at a time can be recorded. This results in potential human comparison errors when deciphers splice and fault locations. In multiple conductor cables, this problem is even more evident.

Another problem that has arisen with the use of a currently available TDR, is cable medium with changing segment impedance. Often times, a cable contains several segments of different conductive mediums spliced together to form one cohesive length of cable. The reason segmented cables exist is due to portions of the length having been replaced with different conductor materials because of damage to the cable or the need replace particular sections of the cable with a different medium. A change in the medium will affect the impedance because of small differences in the cable's, manufactured geometry or materials thereby affecting signal's velocity of propagation (VOP). This results in inaccurate information of anomalies further down the conductor. Other factors may affect the VOP as well, such as a change in the dielectric material that separates conductors within a cable. Water flooding in the interior of cables that use air as part of the dielectric separation of conductors has been a particular problem that affects the VOP of a signal from a TDR.

Thus, there exists a need for graphically representing information collected from a device propagating a signal along the length of a cable.

SUMMARY OF THE INVENTION

One embodiment of the present invention provides a method, apparatus and computer-readable medium for improving the quality and accuracy of information collected by propagating a signal along a length of cable in order to pinpoint specific anomalies along the length of cable. This embodiment improves quality and accuracy by displaying multiple waves simultaneously and combining several steps of signal processing to raw data collected by a TDR. The signal processing steps include: signal data collection, wave reversal, wave shifting, multi-wave display, segmented velocity of propagation, multi cursor, and wet cable calculator.

Using the various embodiments of the present invention in conjunction with a TDR, a technician can record, modify, and display several waveforms corresponding to specific cables from either end of specific cables and process the information collected and recorded at a later time. Specifically, a technician can take a set of two recorded waveforms that are collected from the same cable and compare the waveforms to determine the location of anomalies. If the two waveforms are recorded from opposite ends of the cable, then wave reversal can be used to process the waveforms in order to produce a more accurate representation of the location of anomalies along the cable.

As a non-limiting example, if the two waveforms are recorded from two different points on a cable in the same direction of propagation, then wave shifting can be used to process the waveforms in order to produce a more accurate representation of the location of anomalies along the cable.

In order to more accurately decipher the location of anomalies along a set of conductors, multiple waveforms can be displayed simultaneously. A technician can easily pinpoint the location of particular anomalies, such as three phase faults or severed cables, by analyzing several waveforms simultaneously.

Additionally, in another embodiment of the present invention, the accuracy of locating anomalies can be improved if the technician is aware of segments of differing mediums along the length of cable. By identifying the particular medium of the segment on which the signal is propagating, the TDR can compensate for a change in VOP which would affect the accuracy of the anomaly's actual location. A typical TDR will measure the time interval between two cursors that can be manually or automatically positioned. Because of this limitation of two cursors, several segments had to be analyzed separately. However, the various embodiments of the present invention are capable of employing several cursors simultaneously to analyze the entire length of cable with several different mediums, and subsequently each with a differing VOP.

Finally, in still yet another embodiment of the present invention, the calculation of the total length of water affecting the impedance of a cable is now possible. A technician knowing this information is able to adjust the signal processing in order to take this condition into account prior to identifying anomalies and their respective locations along the cable. This embodiment also improves the accuracy of locating anomalies.

A method, apparatus, and computer-readable medium capable of performing actions generally consistent with the foregoing data acquisition and signal processing for determining the location of anomalies along a cable is presented in further detail below.

BRIEF DESCRIPTION OF THE DRAWINGS

The foregoing aspects and many of the attendant advantages of this invention will become better understood by reference to the following detailed description, when taken in conjunction with the accompanying drawings, wherein.

DETAILED DESCRIPTION OF THE PREFERRED EMBODIMENT

Time Domain Reflectometers (TDR) transmit a pulse of electrical energy onto cables that includes two conductors separated by a dielectric material. When the electrical pulse encounters change in the cable that causes the impedance to change, part of the pulse's energy is reflected back toward the TDR. By measuring the amplitude and polarity of the reflected wave, the proportionality of the impedance change can be determined. Additionally, by measuring the time of propagation, the location of the impedance change can also be determined. Typical anomalies that will cause an impedance change include a change in the cable medium, splices, faults, partial discharges, and damage to the cable.

Figure 1:
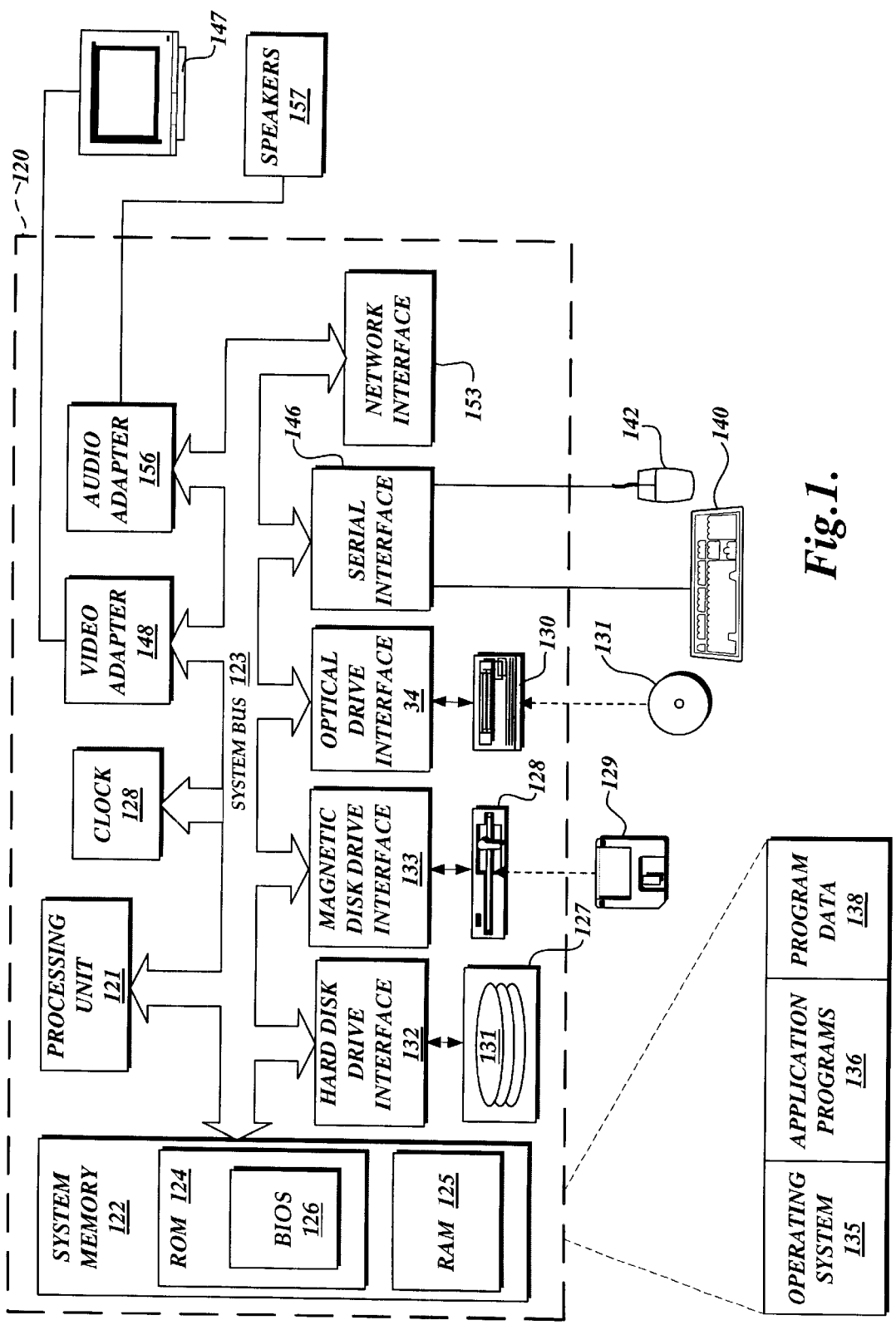
FIG. 1 is a block diagram of a general-purpose computer system for implementing one embodiment of the present invention.

In accordance with one embodiment of the present invention, the TDR Display method source programs execute on a computer, preferably a general-purpose computer configured with basic input/output functions for a handheld device. FIG. 1 and the following discussion are intended to provide a brief, general description of a suitable computing environment in which current embodiments of the invention may be implemented. Although not required, the embodiments of the present invention are described in the general context of computer-executable instructions, such as program modules, being executed by a personal computer. Generally, program modules include routines, programs, objects, components, data structures, etc. that perform particular tasks or implement particular abstract data types. Moreover, those skilled in the art will appreciate that the various embodiments of the present invention may be practiced with other computer system configurations, including hand-held devices, multiprocessor systems, microprocessor-based or programmable consumer electronics, network PCs, minicomputers, mainframe computers, and the like. The various embodiments of the invention may also be practiced in distributed computing environments where tasks are performed by remote processing devices that are linked through a communications network. In a distributed computing environment, program modules may be located in both local and remote memory storage devices.

With reference to FIG. 1, an exemplary system for implementing the embodiments of the invention includes a general purpose computing device in the form of a conventional personal computer 120. The personal computer 120 includes a processing unit 121, a system memory 122, and a system bus 123 that couples various system components including the system memory 122 to the processing unit 121. The system bus 123 may be any of several types of bus structures including a memory bus or memory controller, a peripheral bus, and a local bus using any of a variety of bus architectures. The system memory 122 includes read only memory (ROM) 124, random access memory (RAM) 125, and a basic input/output system (BIOS) 126, containing the basic routines that help to transfer information between elements within the personal computer 120.

The personal computer 120 further includes a hard disk drive 127 for reading from and writing to a hard disk (not shown), a magnetic disk drive 128 for reading from or writing to a removable magnetic disk 129, and an optical disk drive 130 for reading from or writing to a removable optical disk 131, such as a CD ROM or other optical media. The hard disk drive 127, magnetic disk drive 128, and optical disk drive 130 are connected to the system bus 123 by a hard disk drive interface 132, a magnetic disk drive interface 133, and an optical drive interface 134, respectively. The drives and their associated computer-readable media provide nonvolatile storage of computer readable instructions, data structures, program modules and other data for the personal computer 120.

Although the foregoing exemplary environment employs a hard disk, a removable magnetic disk 129 and a removable optical disk 131, it should be appreciated by those skilled in the art that other types of computer-readable media which can store data that is accessible by a computer, such as magnetic cassettes, flash memory cards, digital versatile disks, Bernoulli cartridges, random access memories (RAMs), read only memories (ROM), and the like, may also be used in the exemplary operating environment.

A number of program modules may be stored on the hard disk, magnetic disk 129, optical disk 131, ROM 124 or RAM 125, including an operating system 135, one or more application programs 136, and program data 138. A technician may enter commands and information into the personal computer 120 through input devices such as a keyboard 140 and pointing device 142. Other input devices (not shown) may include a microphone, joystick, keypad, touch screen, scanner, or the like. These and other input devices are often connected to the processing unit 121 through a serial port interface 146 that is coupled to the system bus 123, but may be connected by other interfaces, such as a parallel port, game port or a universal serial bus (USB). A monitor 147 or other type of display device is also connected to the system bus 123 via an interface, such as a video adapter 148. One or more speakers 157 are also connected to the system bus 123 via an interface, such as an audio adapter 156. In addition to the monitor and speakers, personal computers typically include other peripheral output devices (not shown), such as printers.

Figure 2:
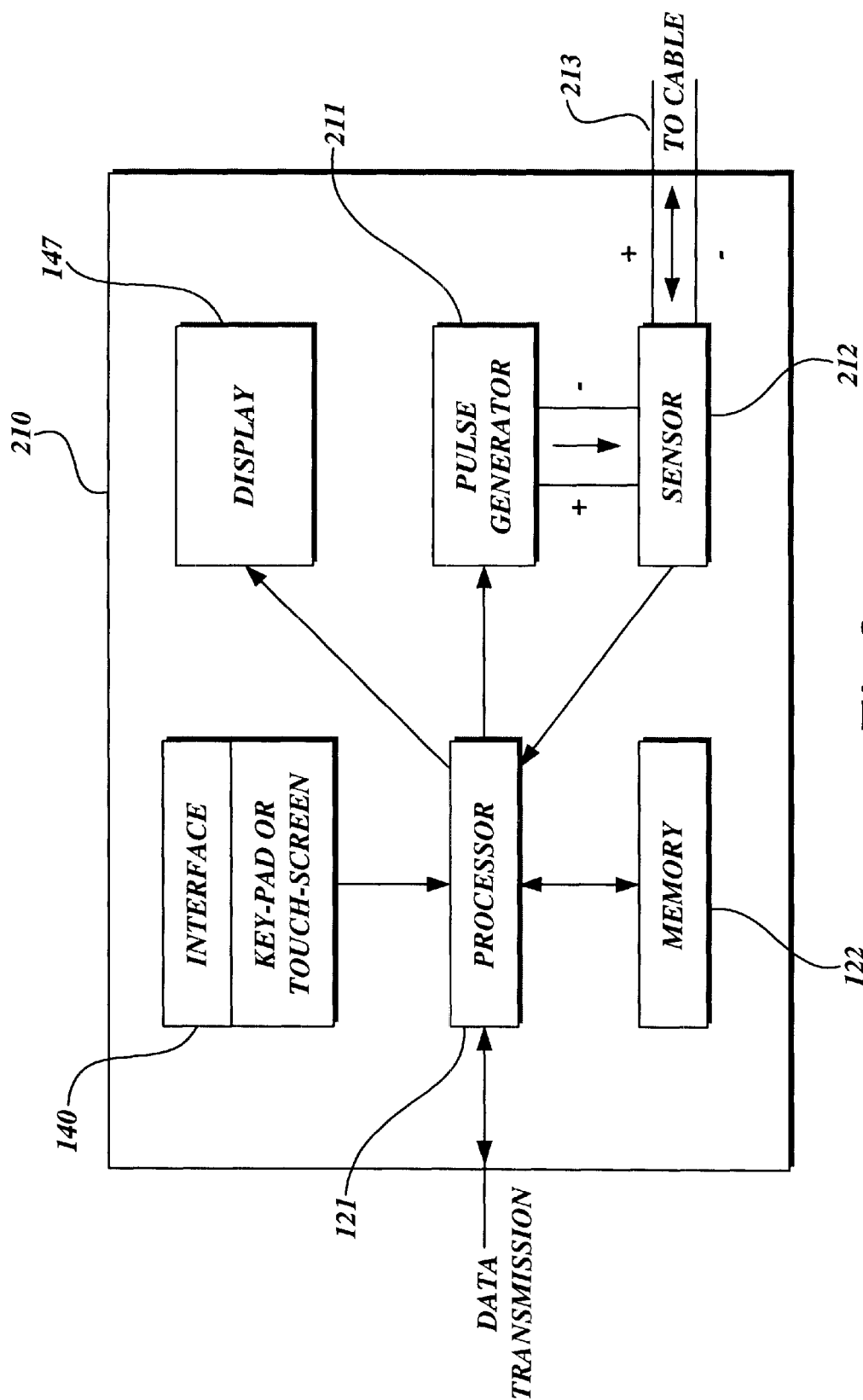
FIG. 2 is a block diagram of a prior art Time Domain Reflectometer (TDR)

The foregoing computer environment may be housed in a handheld device that can be coupled to a pair of conductor cables. FIG. 2 depicts a well known and typical handheld TDR. The computing unit, as described previously is housed in a compartment 210. Depicted within the compartment 210 is the processing unit 121, the display 147, a keypad or touch screen interface 140, system Memory 122, a pulse generator 211, and a pulse sensor 212. When the program is implemented, a pulse is generated at the pulse generator 211 and propagated down the cable 213. The pulse sensor 212 is then able to detect any reflection which occurs due to a change in impedance on the cable 213. As the wave reflections are detected, the program receives pulse information from the pulse sensor 212 and assimilates the information to be displayed in a graphical representation on the display 147. The technician of the TDR is able to interpret information from the graphical representation of the anomalies detected on the cable 213.

Figure 3:
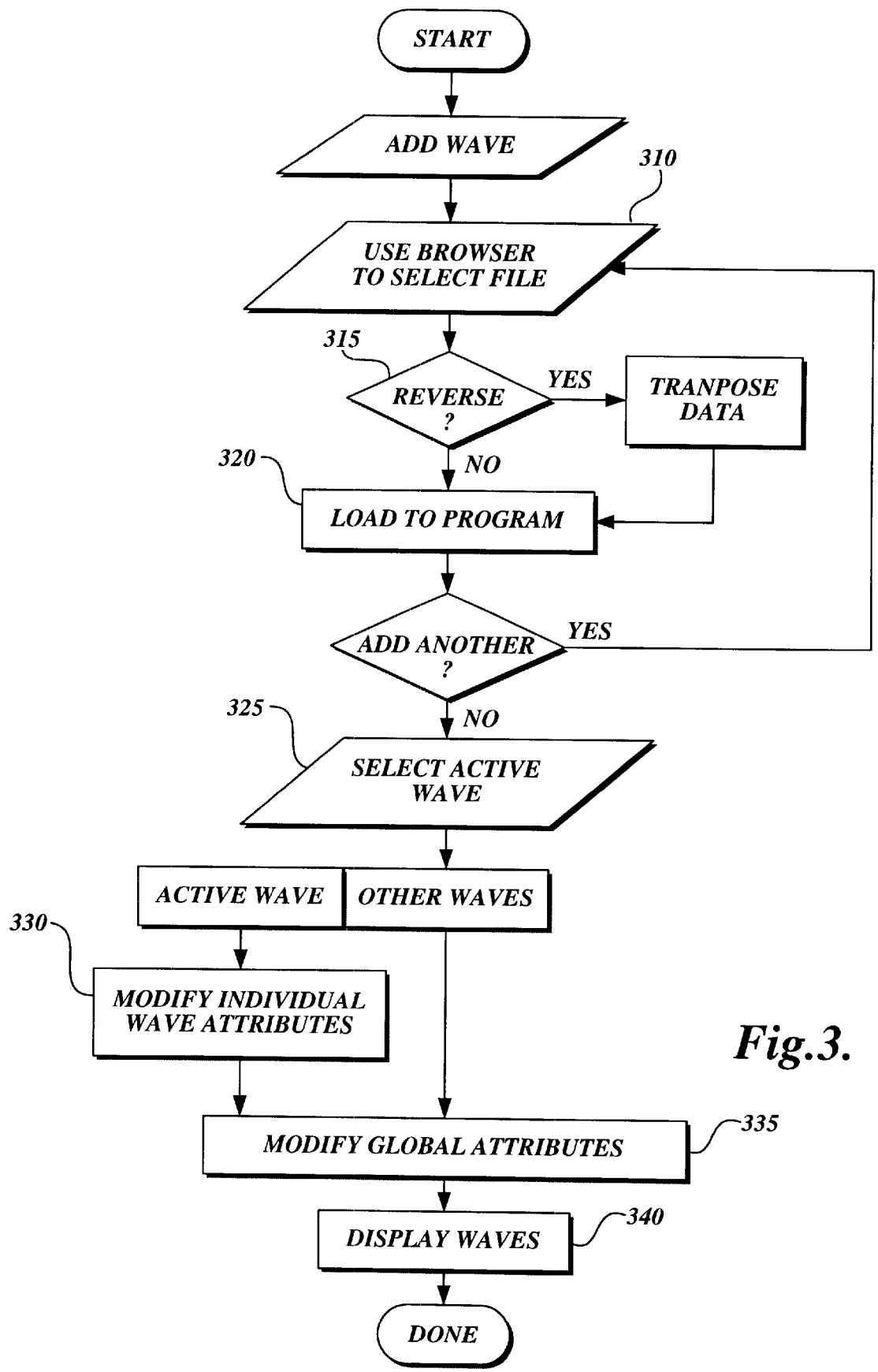
FIG. 3 is a flowchart of an overall program architecture for a method of displaying waves collected by a TDR.

One embodiment of the current invention is a method of recording, processing and displaying the information collected by the TDR. Information previously collected and stored on a computer may also be processed and displayed. FIG. 3 depicts the overall program architecture of the program. When the program is implemented, a technician selects a wave to be added to the display in Step 310. By selecting a wave to be displayed, the data corresponding to the wave is loaded into the program. Loaded wave files can be modified by one of a number of methods described below. Loading a wave is done by using a browsing subroutine which allows the technician to select files from memory or the current live trace. If multiple waves have been loaded, the last wave to be modified (or recently loaded) is the active wave. Only the active wave can be modified individually. To modify a different wave, the technician must select the different wave as active.

Figure 4:
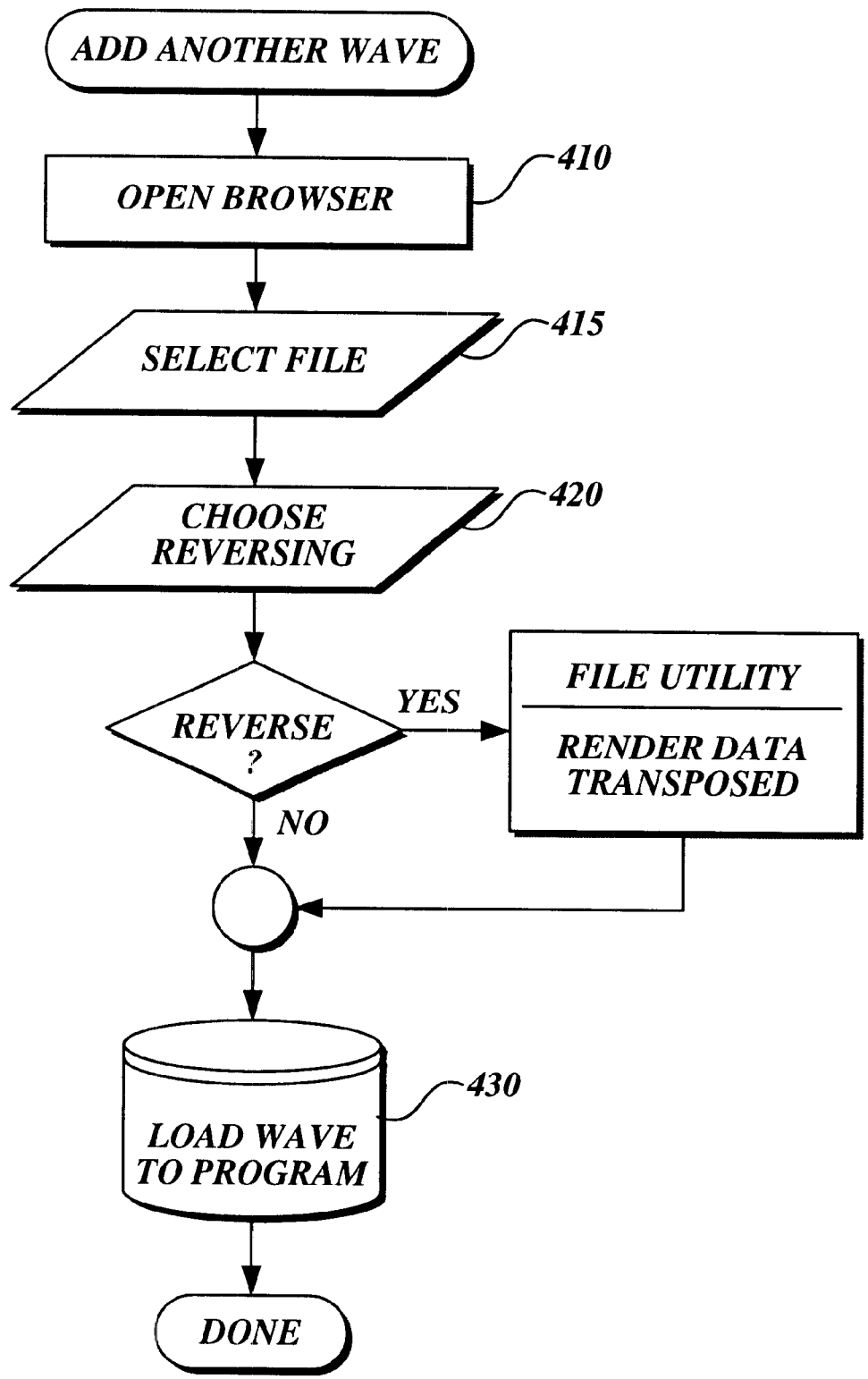
FIG. 4 is a flowchart of a wave reversal subroutine in a method of displaying waves collected by a TDR formed in accordance with one embodiment of the present invention.

Once a particular stored wave is selected to be loaded, the technician is prompted to select whether or not to implement the method of wave reversal in Step 315. If wave reversal is selected, then the wave reversal subroutine is implemented which is depicted in FIG. 4 and discussed later. If the technician selects no wave reversal, then the wave file is loaded to an initial display screen, Step 320. The technician is then asked if the technician wishes to select another wave to be loaded. The technician may repeat Steps 310-320 if another wave is desired, but if not, the program proceeds to an active wave display screen Step 325.

The technician then selects one of the loaded waves to be the active one, step 325. The technician may modify individual wave attributes, Step 330 which will only affect the active wave or may modify global wave attributes, Step 335 which will affect all loaded waves. Individual wave attribute modification include, wave shifting, depicted in FIG. 5 or multi-cursor flagging, depicted in FIG. 8. Global wave attribute modifications include panning zooming and segmented velocity of propagation, depicted in FIG. 7. Additionally, the technician may enable a wet cable calculation on any cable or portion thereof. After, each modification is implemented, all loaded waves are displayed on the display 147 in Step 340. This multi-wave display method is interspersed within the overall flow of FIG. 3 and is presented in greater detail in FIG. 8. Each attribute modification method is discussed in greater detail below.

FIG. 4 is a flowchart of the subroutine for wave reversal. If a technician chooses wave reversal in Step 315, then this subroutine is implemented. As stated above, the wave reversal method is implemented when a particular wave is being loaded. A separate browser window is opened on the display in Step 410 that will allow a technician to select a particular wave file in Step 415. The technician may then choose to implement wave reversal in Step 420. When wave reversal is chosen, a file utility will be opened that renders the normal data in a transposed fashion.

Figure 9:
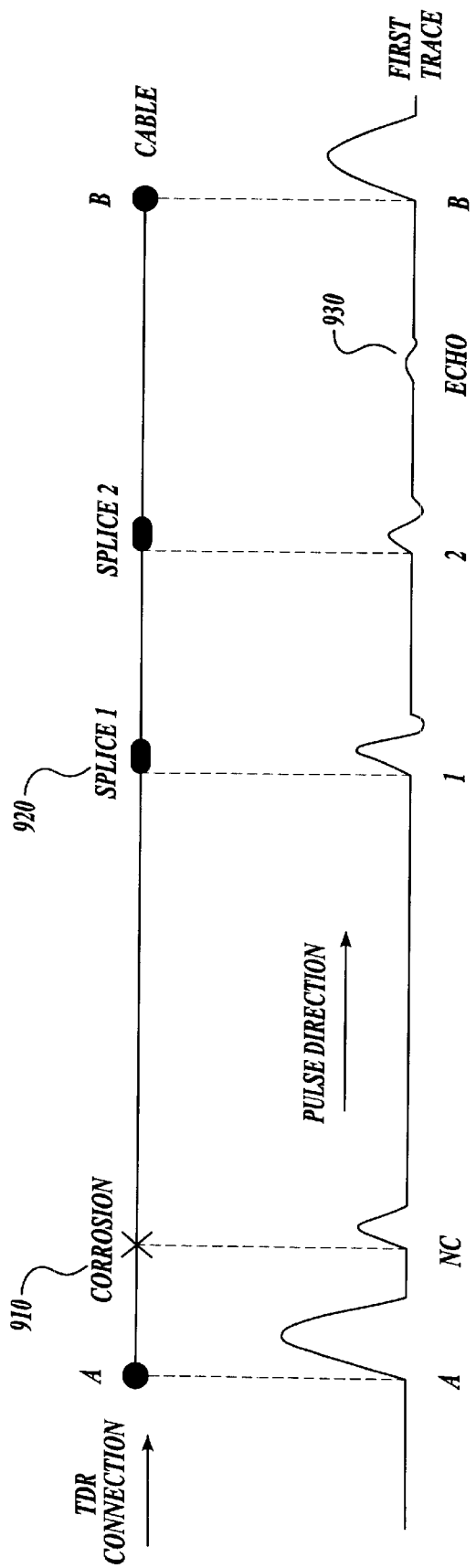
FIG. 9 is an exemplary wave form displayed on a TDR formed in accordance with one embodiment of the present invention.
Figure 10:
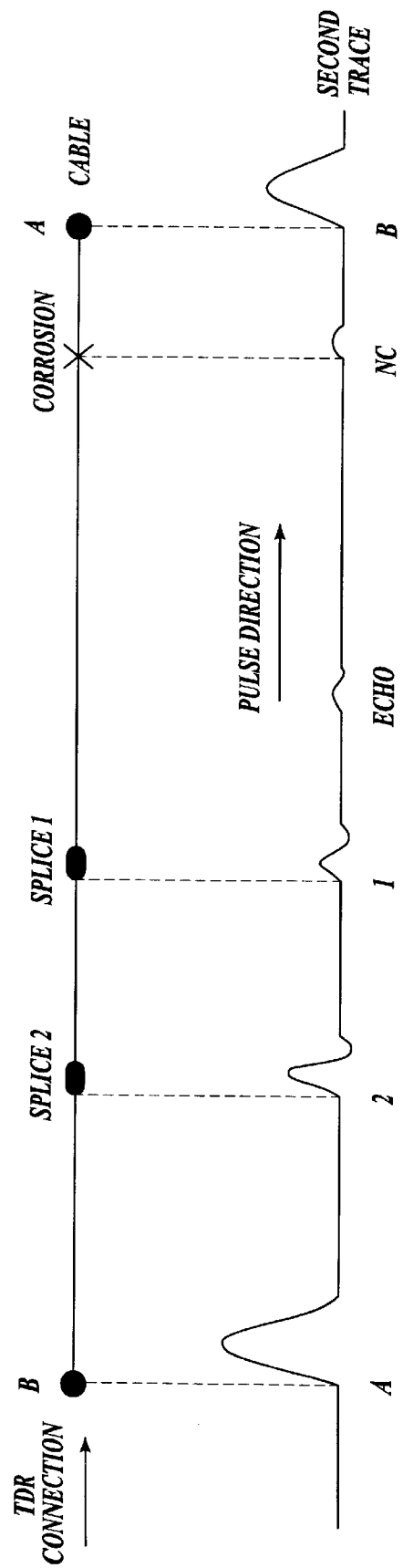
FIG. 10 is an exemplary reversed wave form displayed on a TDR formed in accordance with one embodiment of the present invention.

With wave reversal, two traces of a reflected wave of the same cable can be displayed on the display 147 with one of the traces reversed. The first wave is a recorded trace or a live trace and depicted as a wave propagating from end A to end B as shown in FIG. 9. End A represents the location of the TDR and end B represents the other end of the conductor. A second wave, which is the reversed wave is a recorded trace or a live trace and depicted from end B to end A as shown in FIG. 10. Additionally, end A and B can be transposed, where end B represents the location of the TDR and end A represents the other end of the conductor. While two waves are used in the foregoing example, it should be apparent that the same invention can be applied to more waves, such as six waves (representing reflection waves from both ends of a 3 phase cable system) or more (when representing multiple conductor cable such as used in telecommunications).

As a pulse travels along a cable, its amplitude is attenuated. Imperfections, such as splices and corrosion, often called anomalies, will reflect a portion of the signal wave back to the TDR. Consequently, reflections coming from farther along a cable are smaller than reflections coming from close in. In addition to this attenuation from the cable, objects the pulse encounters will consume part of the pulse energy also attenuating the pulse. If there are two splices on a cable, the wavelike reflection from the second will generally appear smaller than the first. The reflection from neutral corrosion is a small positive only reflection. It is often small enough to be difficult to recognize.

Figure 11:
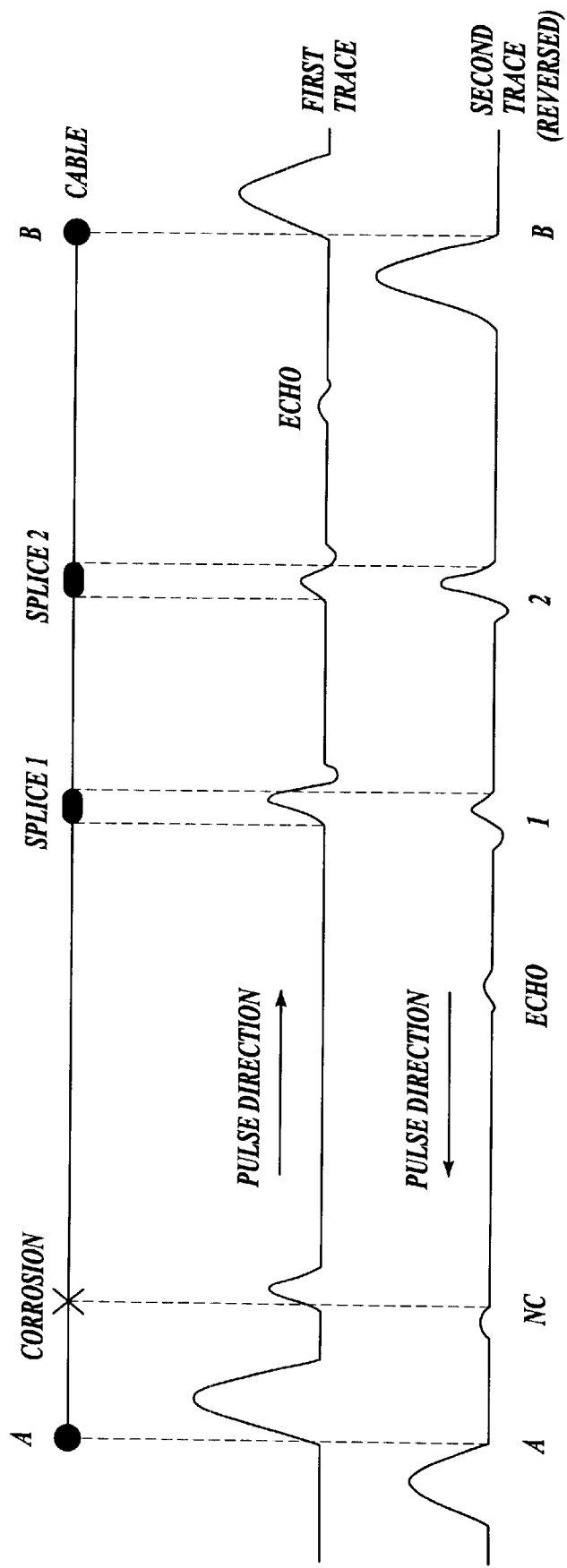
FIG. 11 is an exemplary combination of a wave form and its reversed trace displayed on a TDR formed in accordance with one embodiment of the present invention.

Referring back to FIG. 4, in Step 430, both traces are displayed at the same time vertically adjacent and with the either the first or the second trace live, but not both. Both may also be from memory, however. The second trace will be displayed reversed left to right so that ends A and B of both traces correlate. This is shown in FIG. 11. As is shown the echoes do not match up vertically and it easily deciphered as merely an echo, whereas other anomalies occur in the same location. Also shown in FIG. 9 are representative anomalies that a TDR will locate and display. Corrosion 910, a splice 920, and an echo 930 are shown on this particular trace.

Corrosion reflections and sometimes splice reflections can also be confused with echoes. These echoes come from the pulse and reflection bouncing back and forth between objects like splices. Wave reversal will make the difference between echoes and true reflections more obvious. As a non-limiting example, with only one wave displayed, a small reflection which may be an echo or an anomaly far from the TDR cable cannot be easily identified. However, when the same wave is reversed and viewed from the second end, an echo will not be in the same place. When the second wave is reversed and placed along the first, anomalies that are echoes become much more obvious.

Figure 12:
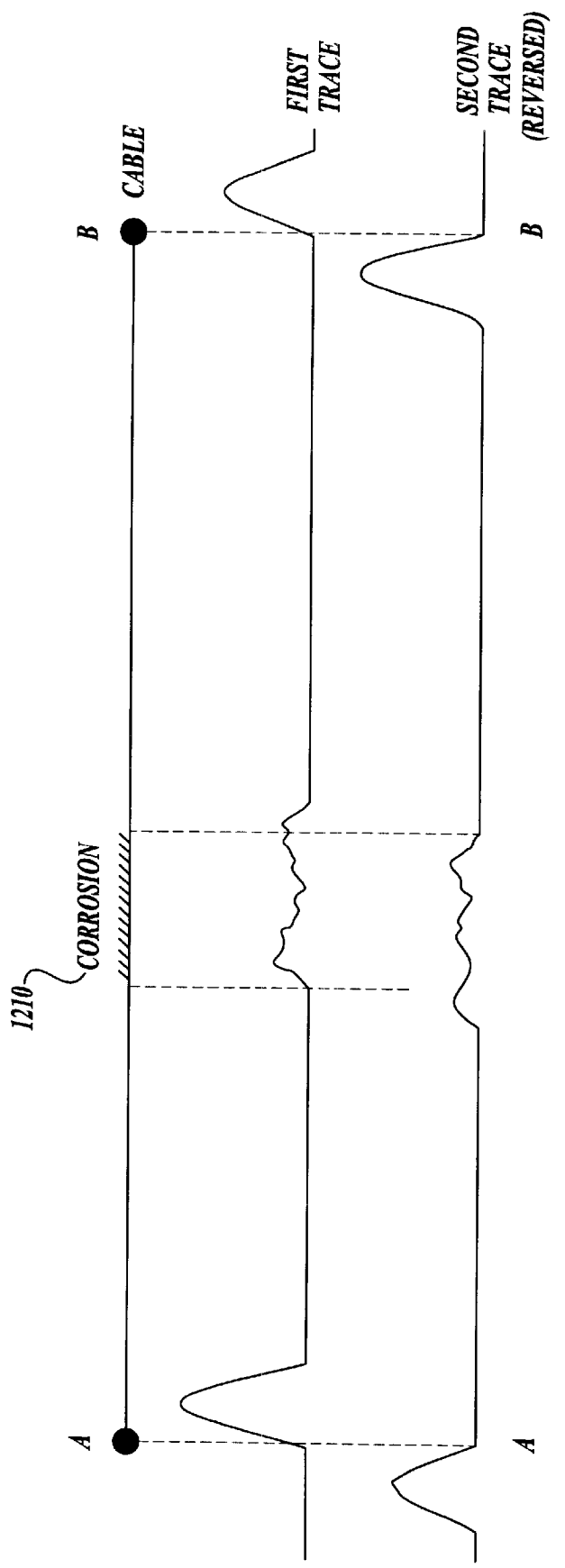
FIG. 12 is an exemplary wave form showing corrosion displayed on a TDR formed in accordance with one embodiment of the present invention.

When the view from both ends are lined up using wave reversal, the reflection of some objects will appear to not line up. This is because the left edge of the reflection is the point where the pulse first encounters the left edge of the object. When a trace is reversed, the right side of the reflection is at the right side of the object. Since the two traces are views of the same cable from opposite ends, the difference in the positions of the two reflections is the difference between the true position of the left and right ends of the object. In this way, the length of an object can be measured. This is useful because the length of a reflection is longer than the length of the object that created it. It is particularly useful in measuring the extent of corrosion on power cables. This corrosion 1210 is shown in FIG. 12.

Figure 5:
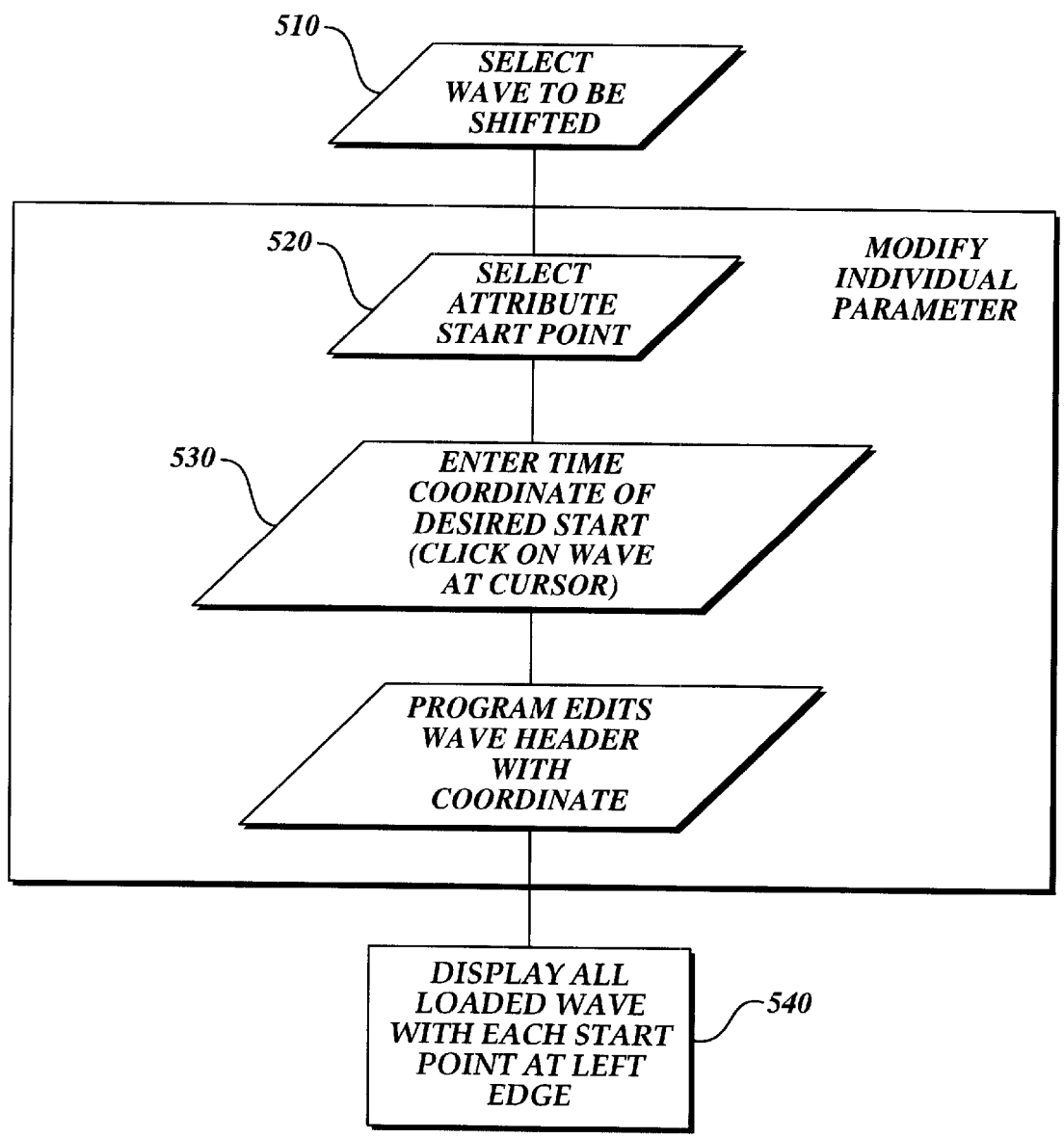
FIG. 5 is a flowchart of a wave shifting subroutine in a method of displaying waves collected by a TDR formed in accordance with one embodiment of the present invention.
Figure 13:
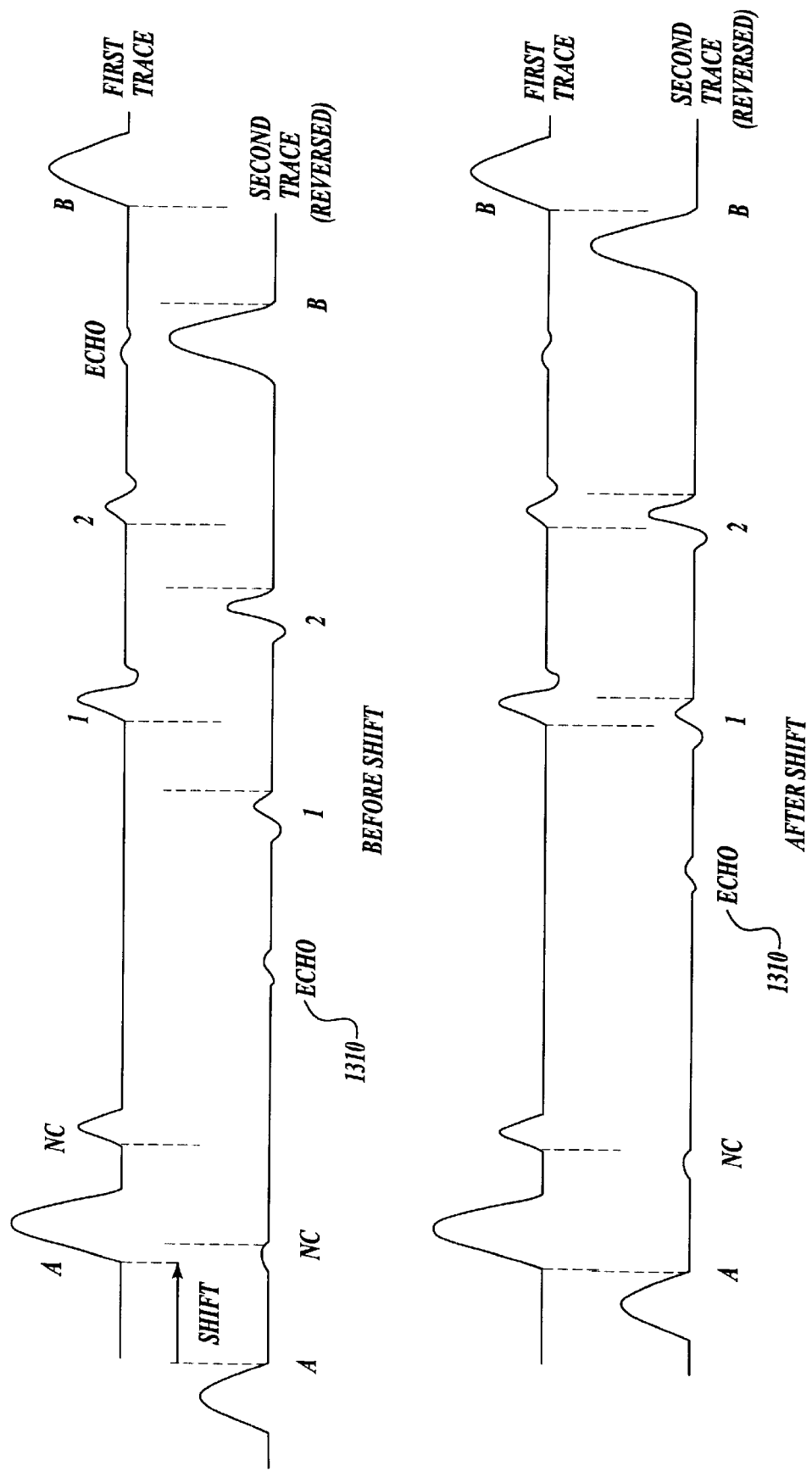
FIG. 13 is an exemplary comparison multi-wave form displayed on a TDR formed in accordance with one embodiment of the present invention.

FIG. 5 is a flowchart of the subroutine for wave shifting. Wave shifting will move an active wave horizontally, as represented on the display, relative to other waves, such that cable end reflections or anomalies can be correlated. This is shown generally is FIG. 13. Wave shifting is necessary to aid in utilizing the previous function (wave reversal). Without wave shifting, the second trace, which is a reversed view of the same cable, the time coordinate would not correlate to the first, thus making any comparison moot. With both, it is possible to see when a reflection changes its apparent position if viewed from the other end. This will make echoes 1310 more obvious as they will not correlate to any reflection on a companion trace.

Referring back to FIG. 5, in Step 510, a technician selects a particular wave to be shifted. In Step 520, the technician selects starting point for the wave shift. In Step 530, the program computes the time coordinate for the start of the wave shift. After these technician inputs are entered, the program edits the wave with starting point and time coordinate parameters. After computation, the new wave is displayed once again in Step 540.

Figure 6:
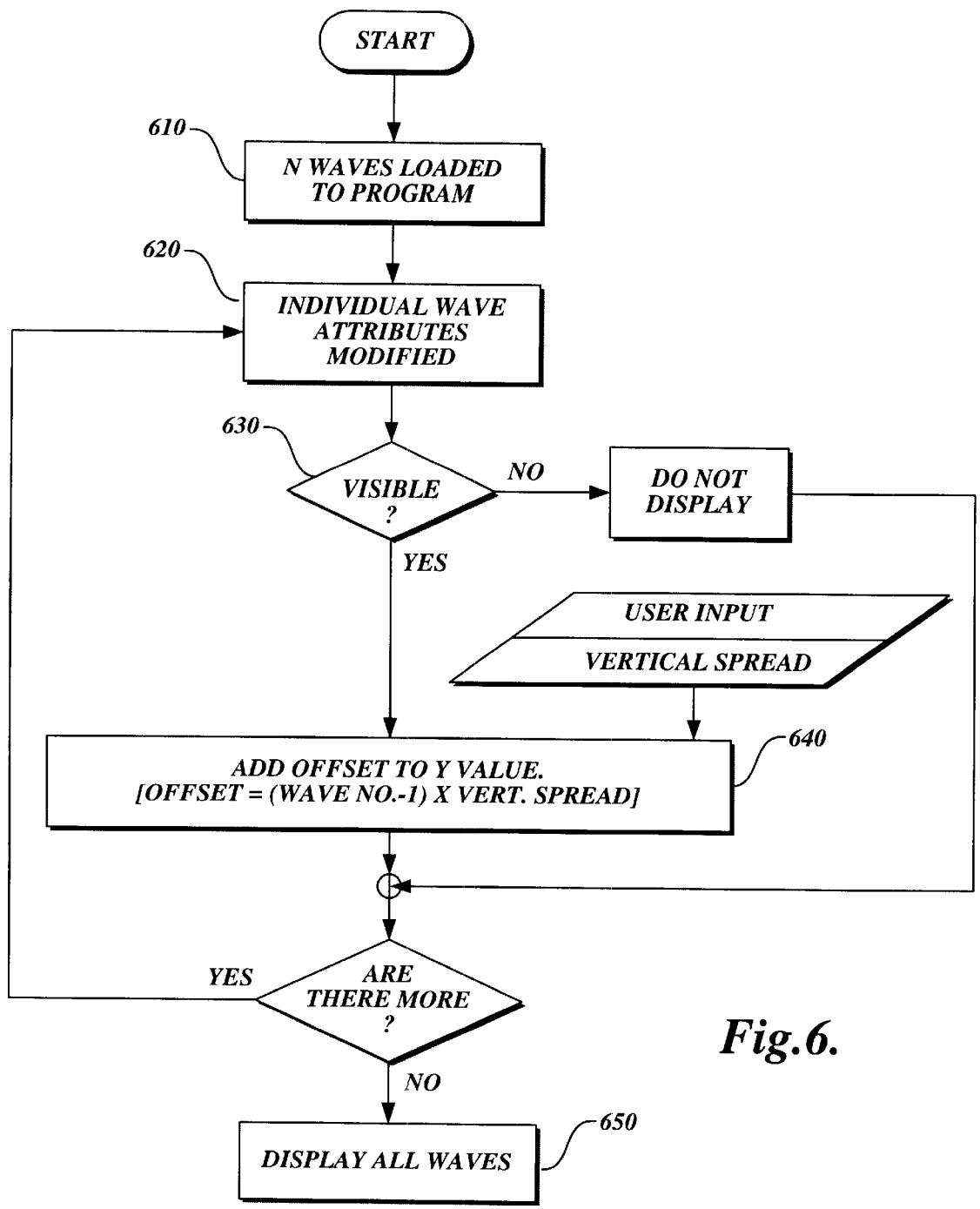
FIG. 6 is a flowchart of a multi-wave display subroutine in a method of displaying waves collected by a TDR formed in accordance with one embodiment of the present invention.

FIG. 6 is a flowchart of the multi-wave display function of the present invention. In the present art, a single channel TDR typically can display two waves from memory or one from memory and the other live (frequently updated with current data from the cable that the TDR is currently connected to). In one embodiment of the present invention, more than two waves can be displayed at the same time using a single channel TDR. Since many power cables being inspected are part of a three phase system (one circuit consisting of three parallel cables), with certain embodiments of the present invention all three phases can be surveyed, recorded, and then displayed with a single channel TDR reducing complexity and cost.

Figure 14:
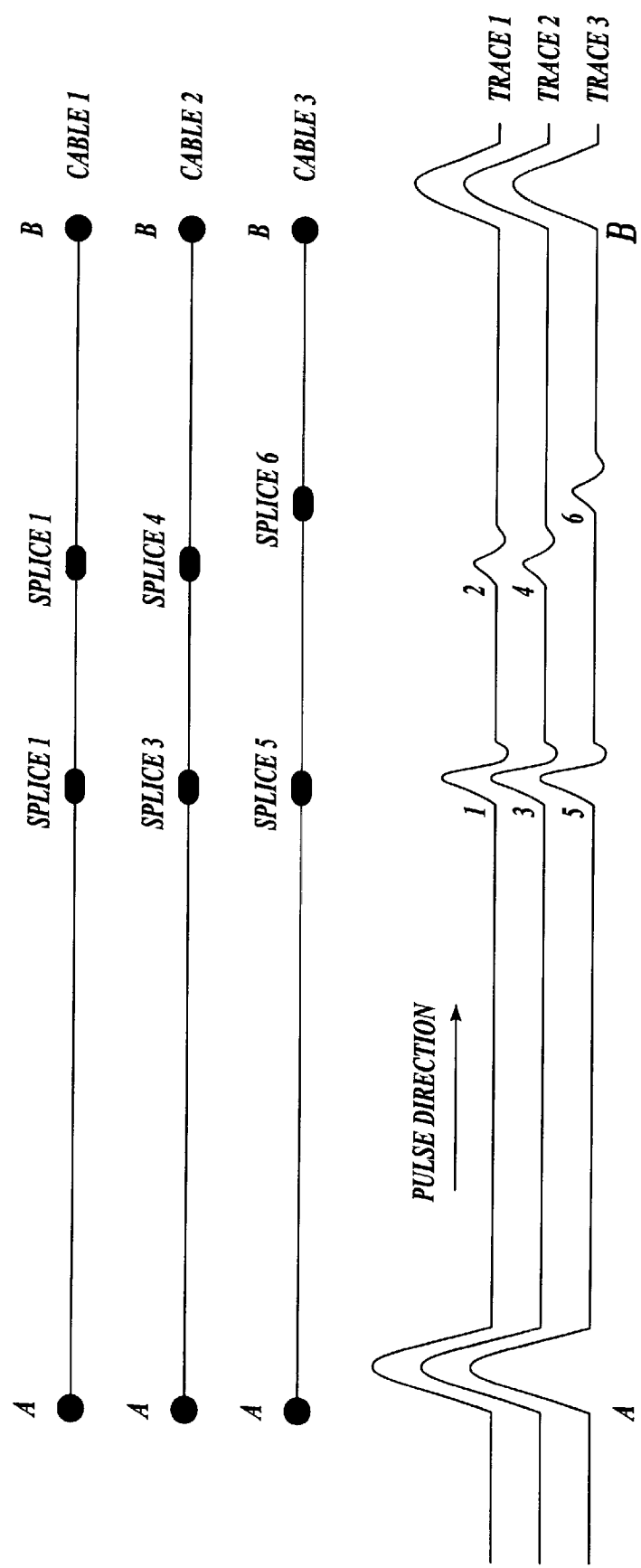
FIG. 14 is an exemplary three phase wave form displayed on a TDR formed in accordance with one embodiment of the present invention.

Multi-wave display will allow more than two (usually three and sometimes six) traces to be displayed simultaneously in any combination of a single live trace while the rest are from stored files. This will facilitate understanding and recognition of cable problems in multi-phase cable systems. This concept is exemplified in FIG. 14, whereby three cables of a three-phase system are shown vertically correlated for easy comparison. When used with wave reversal, up to six waves may be displayed simultaneously. The traces can be displayed vertically adjacent to aid visualization of differences or could be merged using datapoint addition, averaging, or subtraction, to form an composite trace to aid visualization of anomalies common to all.

During the multi-display method embodiment of the present invention, individual waves are loaded into the display program in Step 610. With each addition, individual wave attributes can be modified in Step 620 (wave reversal, wave shifting) in addition to technician selections of whether the wave is to be visible in Step 630 and what distance of vertical separation is to be set between displayed waves (vertical offset value) in Step 640. These steps roughly correlate to the steps of wave reversal 315, individual attribute modification 330, and global wave attribute modification 335. Once all waves have been loaded and modified accordingly, each visible wave is displayed on the display 147 in Step 650.

Figure 7:
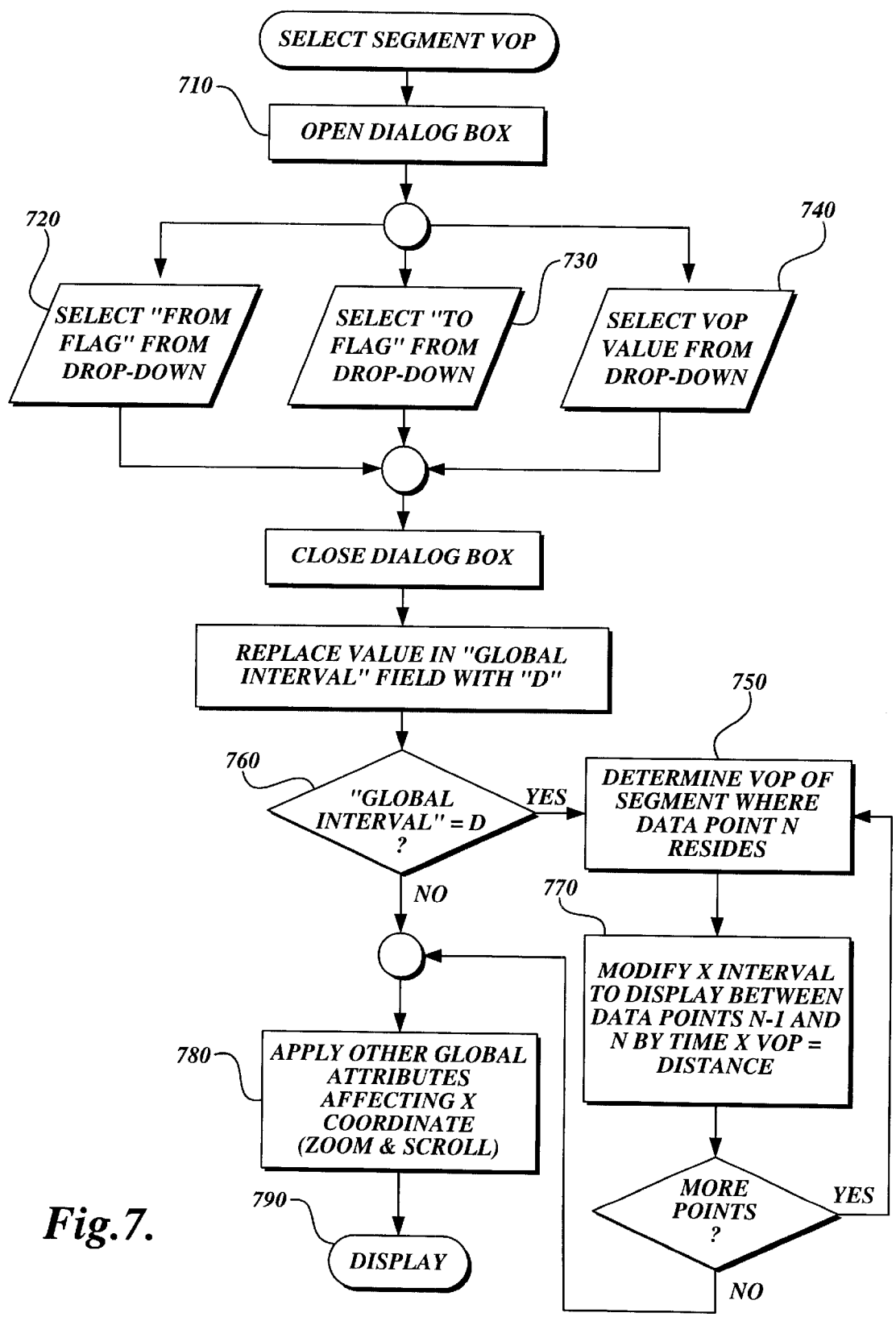
FIG. 7 is a flowchart of a segmented velocity of propagation subroutine in a method of displaying waves collected by a TDR formed in accordance with one embodiment of the present invention.
Figure 15:
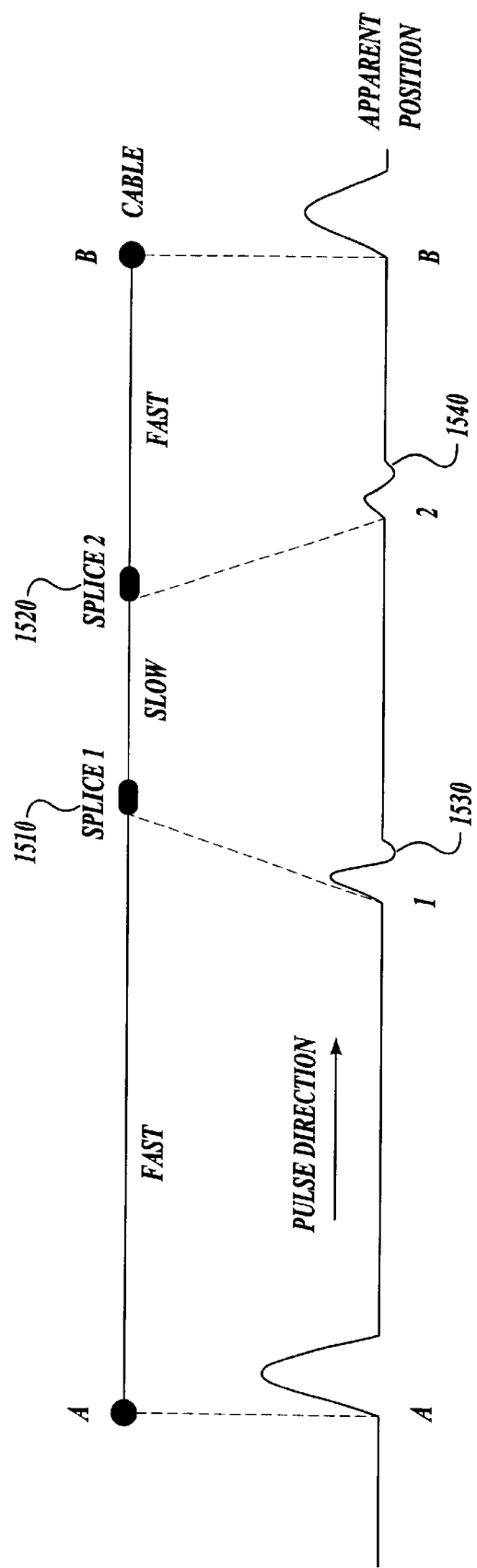
FIG. 15 is an exemplary set of wave forms displayed on a TDR with segmented VOP compensation formed in accordance with one embodiment of the present invention.

FIG. 7 is a flowchart of the segmented velocity of propagation subroutine of the program. Segmented Velocity of Propagation (VOP) will allow the trace(s) to be subdivided into segments with independent VOP settings. A VOP setting is a determination of the rate at which a pulse will travel along a cable and is governed by the physical attributes of the conductor. These VOP numbers are well known in the art for all typical conductor materials. This VOP setting can compensate and correct for sections of the cable having different speeds of pulse propagation. These different speeds can come from different types of cables being spliced together, or from the effects of other post manufacture differences such as water or filling compounds in telecommunication cables. Without segmenting, slow sections of cable would appear longer or shorter than actual length and all intermediate distance measurements would be inaccurate because a single VOP setting would only be able to arrange the total cable's VOP. FIG. 15 illustrates how a particular length of cable can be misrepresented in this fashion.

Figure 16:
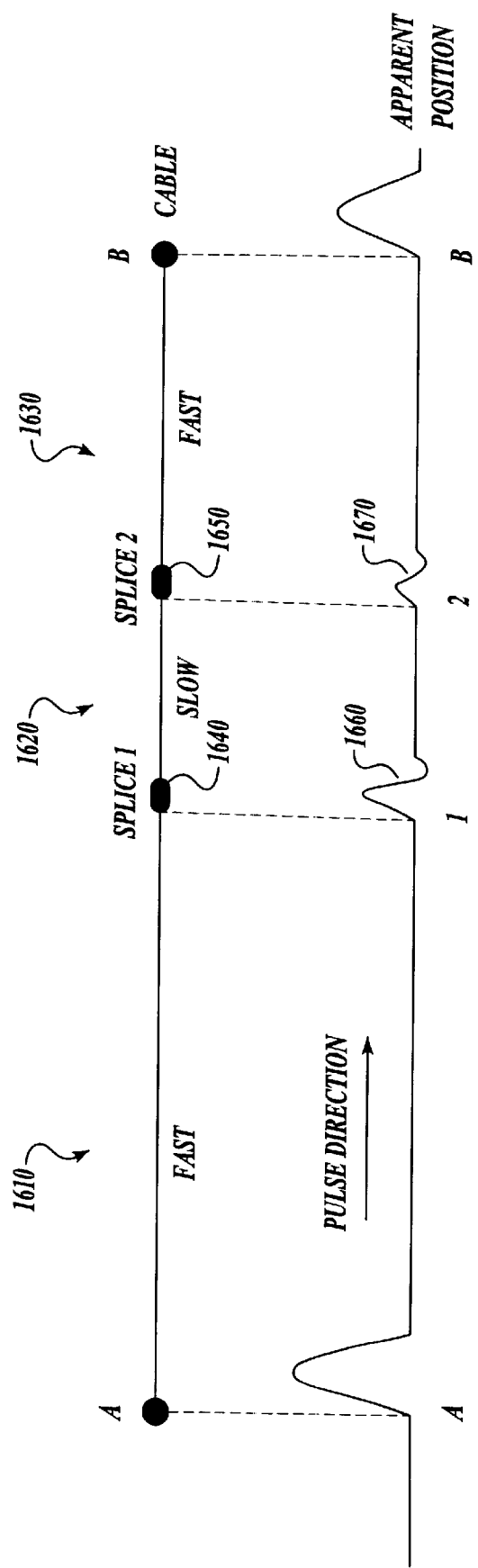
FIG. 16 is an exemplary set of wave forms displayed on a TDR with segmented VOP compensation formed in accordance with one embodiment of the present invention.

If the VOP between splice 1, referred to by the number 1510, and splice 2, referred to by the number 1520, is slower than the rest of the cable, the reflections 1530 and 1540 will appear in the wrong location. In FIG. 16, the VOP of the three segments 1610, 1620, and 1630 that make up the cable are set independently. This will adjust the horizontal scale of the display to compensate for the different speeds and consequently splice 1 1640 will correlate correctly to its reflection 1660 as will splice 2 1650 correlate correctly to its reflection 1670.

To set a desired VOP for a particular segment, a technician opens a dialog box in Step 710. The technician chooses a "from flag" location in Step 720, a "to flag" location in Step 730 and a VOP value for the particular segment in Step 740. After these attributes are selected, the technician closes the dialog box and the value in the set in Step 740 replaces the default VOP variable "D" in Step 750. At this point, if the new value of "global interval" is not "D", the program will determine the new VOP of the segment containing the pertinent data point in Step 760 and modify the X interval displayed between the pertinent data points rendered in distance in Step 770. Once the new wave files have been modified and once the technician enters any new zoom and scroll options in Step 780, all new waves are displayed in Step 790 on the display 140.

In one particular embodiment, a segment may be analyzed to determine the length of wet cable that is present. When some telecommunication cables are installed, they contain air between the conductors of the pairs. Over time, this space can become filled with water, which degrades the quality of the cable. In conventional use of a TDR, the water can be seen as a negative reflection and placing cursors at both ends of the reflection can approximate the length of the wet section. However, water may not fill a long contiguous section that is easily identified. It can be separated into many wet spots from a few inches long to hundreds of feet. In accordance with one embodiment of the present invention, a TDR can be used to automatically calculate the total length of a cable that contains water using the following equation:

$$Lw=Vw\times\{[L-(Dt\times Vd)]/(VOPw-VOPd)\}$$

Where:

VOPw=speed of pulse in wet cable

VOPd=Speed of pulse in dry cable

Dt=Time required for pulse to transit cable segment

L=True length of cable segment

Figure 7A:
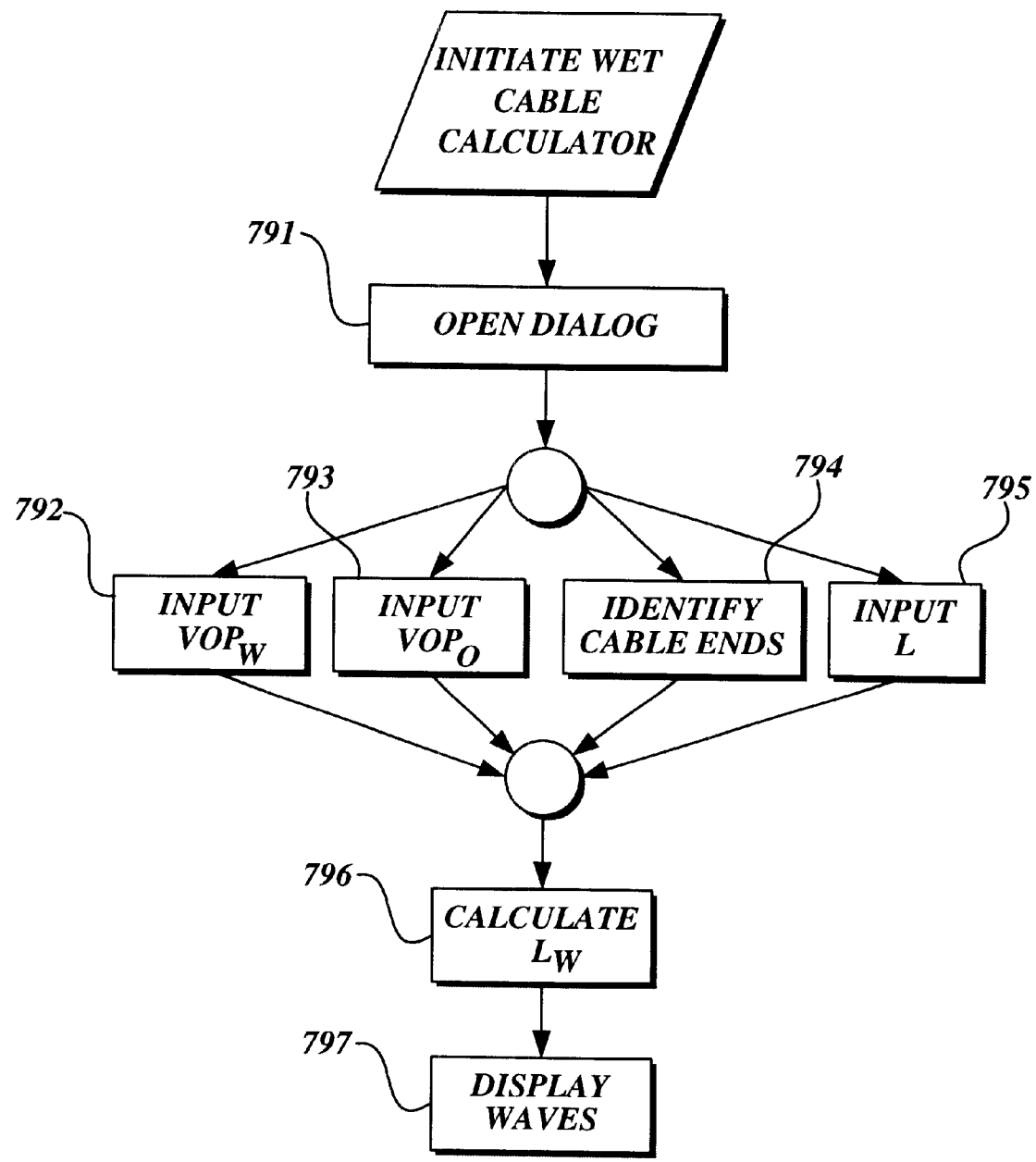
FIG. 7A is a flowchart of a calculation for total length of water affecting the impedance of a cable formed in accordance with one embodiment of the present invention.

Lw=Total portion of segment that is wet $VOP_w$ and $VOP_d$ are properties that can be predicted or measured for a given cable type. As seen best by referring to FIG. 7A, these values are entered by the technician in Steps 792 and 793 respectively. When a technician uses the wet cable function, known data from a cable information chart is determined and the technician inputs theses values into the TDR previous to calculation. Alternatively, the TDR would have this data stored in a file from which the technician would choose a cable type. Dt is measured with the TDR by placing cursors at the reflections from the beginning and end of the cable, Step 794. The operator would input the true length of the cable (L) Step 795 after measuring with a wheel. With this information the TDR can automatically calculate Step 796 and display Step 797 the total length of all portions of the cable that are wet.

Figure 8:
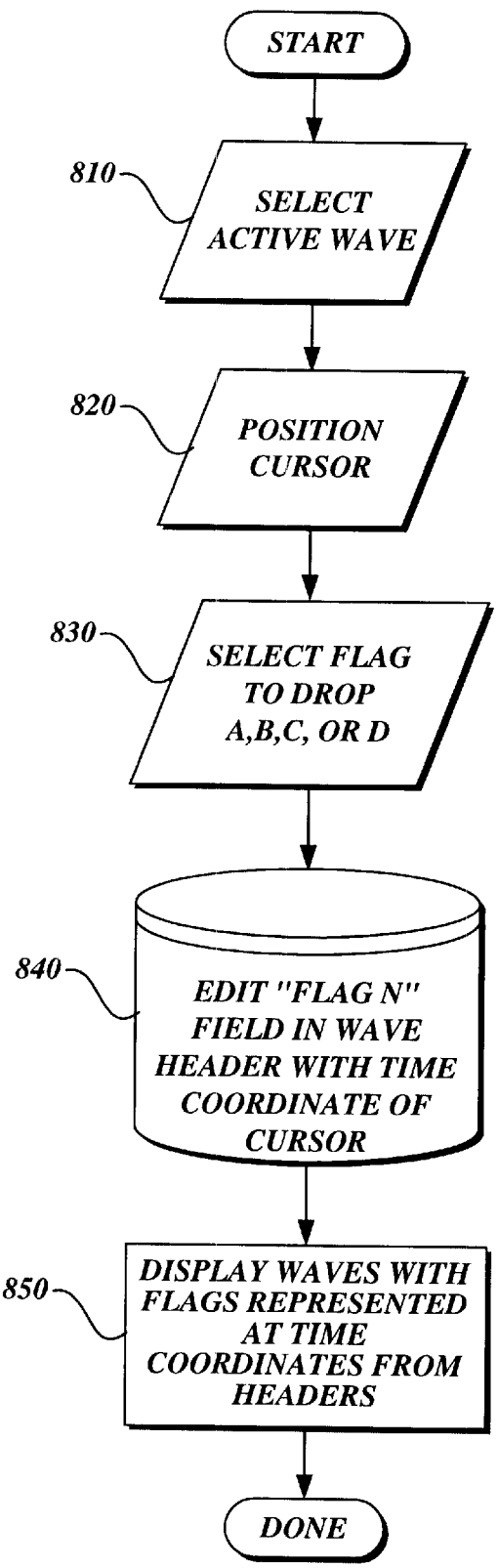
FIG. 8 is a flowchart of a multi-cursor/flagging subroutine in a method of displaying waves collected by a TDR formed in accordance with one embodiment of the present invention.

FIG. 8 is a flowchart of the method for adding, removing or adjusting flags and/or cursors to an active wave. A traditional TDR measures the time interval between two cursors that can be manually or automatically positioned on the displayed trace. A cursor is an indication of a point on a trace which the technician seeks to identify for the purposes of gaining information about that particular location. The cursor can be manually positioned at any point along a trace using an input device such as a mouse. The TDR can calculate the length between two cursors. The ability to position more than two cursors on the trace would facilitate the segmented VOP and multi-trace functions above. Any number of cursors could be created and individually positioned on a specified trace. The time interval between selected cursors would then be multiplied by that segment's VOP to derive and display each segment's length.

One embodiment of this invention would take the form of a single active cursor and many flags. The active cursor can be maneuvered along the X coordinate axis and will represent points corresponding to its X coordinate for all loaded waves. A flag can be placed on a particular loaded wave. Each flag would be represented by a tick mark on one particular wave of a multi-wave display. If that wave is shifted relative to the other waves, the flag would remain associated with the X coordinate of that single wave. On the other hand, the active cursor would not shift with a single wave. It is only associated with the X coordinate of the global display and would shift positions as the global zoom and scroll are adjusted.

Flags can be added by a technician by selecting an active wave in Step 810. The technician then positions the cursor where a flag is to be added, removed or modified in Step 820. The technician can then add, remove or modify a flag in Step 830, the culmination of which is an edit of the flag field for the active wave with a new X coordinate for each flag added, removed or modified in Step 840. As flags are added, removed or modified, they are displayed as tick marks on their respective waves in Step 850, on the display 147.

The foregoing functions can be accomplished using computer executable instructions embodied on a computer-readable medium. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for assimilating data using a time domain reflectometer, the method comprising:

recording into memory at least three reflection waves of a signal propagated from a time domain reflectometer onto conductors;

modifying one or more of the at least three reflection waves; and simultaneously displaying the at least three reflection waves on a display of a time domain reflectometer.

2. The method of claim 1, wherein modifying one or more of the at least three reflection waves further comprises:

i. employing wave reversal signal processing; and ii. employing wave shifting signal processing.

3. The method of claim 2, wherein employing wave reversal signal processing further comprises, adjusting a location of at least one of the at least three reflection waves in a predetermined direction to correlate the at least three reflection waves.

4. The method of claim 3, wherein employing wave reversal signal processing further comprises, displaying one or more of the at least three reflection waves in at least one of the following ways:

i. from left to right on the display, wherein a leftmost point represents a location of the time domain reflectometer;

ii. from right to left on the display, wherein a leftmost point represents a location of the time domain reflectometer;

iii. from left to right on the display, wherein a rightmost point represents a location of the time domain reflectometer; and iv. from right to left on the display, wherein a rightmost point represents a location of the time domain reflectometer.

5. The method of claim 2, further comprising modifying at least one of the at least three reflection waves in one or more of the following ways:

i. employing a multi-cursor signal processing step;

ii. employing a segmented velocity of propagation signal processing step; and iii. employing a wet-cable calculation processing step.

6. The method of claim 5, wherein employing a segmented velocity of propagation signal processing further comprises:

i. defining two or more segments of one or more of the at least three reflection waves;

ii. determining a velocity of propagation adjustment for each of the two or more segments; and iii. displaying each of the two or more segments of the one or more of the at least three reflection waves using the determined velocity of propagation adjustment for each of the two or more segments to modify a horizontal axis of a display.

7. The method of claim 5, wherein employing a multi-cursor signal processing step further comprises:

i. assigning three or more cursors to the at least three reflection waves; and ii. calculating a distance between any two or more of the three or more cursors.

8. The method of claim 5, wherein employing a wet-calculation processing step includes the equation $Lw=Vw \times \{[L-(Dt \times Vd)]/(VOPw-VOPd)\}$.

9. The method of claim 1, further comprising the signal propagated onto one or more conductors is an electrical pulse.

10. The method of claim 1, wherein modifying one or more of the at least three reflection waves includes at least one of the following ways:

i. employing wave shifting signal processing;

ii. employing multi-cursor signal processing;

iii. employing segmented velocity of propagation signal processing; and iv. employing wet cable calculation processing.

11. The method of claim 10, wherein employing wave reversal signal processing further comprises, displaying one or more of the at least three reflection waves in at least one of the following ways:

i. from left to right on the display, wherein a leftmost point represents a location of the time domain reflectometer;

ii. from right to left on the display, wherein a leftmost point represents a location of the time domain reflectometer;

iii. from left to right on the display, wherein a rightmost point represents a location of the time domain reflectometer; and iv. from right to left on the display, wherein a rightmost point represents a location of the time domain reflectometer.

12. The method of claim 10, wherein employing wave shifting signal processing further comprises, adjusting a location of at least one of the at least three reflection waves in a predetermined direction to correlate the at least three reflection waves.

13. The method of claim 10, wherein employing a segmented velocity of propagation signal processing step further comprises:

i. defining two or more segments of one or more of the at least three reflection waves;

ii. determining a velocity of propagation adjustment for each of the two or more segments; and iii. displaying each of the two or more segments of the one or more of the at least three reflection waves using the determined velocity of propagation adjustment for each of the two or more segments to modify a horizontal axis of a display.

14. The method of claim 10, wherein employing a multi-cursor signal processing step further comprises:

i. assigning three or more cursors to the at least three reflection waves; and ii. calculating a distance between any two or more of the three or more cursors.

15. The method of claim 10, wherein employing a wet-calculation processing step includes the equation $Lw=Vw \times \{[L-(Dt \times Vd)]/(VOPw-VOPd)\}$.

16. The method of claim 1, wherein the signal propagated onto the conductors is an electrical pulse.

17. A computer-readable medium having computer-executable instructions for performing the method recited in any one of claims 1–16.

18. A computer system having a processor, a memory, and an environment, the computer system operable for performing the method recited in any one of claims 1–16.

19. A method of assimilating data using a time domain reflectometer, the method comprising:

a. recording into memory at least three reflection waves of a signal propagated from a time domain reflectometer onto conductors;

b. modifying one or more of the at least three reflection waves by employing wave shifting signal processing; and c. simultaneously displaying the at least three reflection waves on a display of a time domain reflectometer.

20. The method of claim 19, wherein modifying one or more of the at least three reflection waves includes employing wave reversal signal processing.

21. The method of claim 20, wherein employing wave reversal signal processing further comprises, displaying one or more of the at least three reflection waves in at least one of the following ways:

a. from left to right on the display, wherein a leftmost point represents a location of the time domain reflectometer;

b. from right to left on the display, wherein a leftmost point represents a location of the time domain reflectometer;

c. from left to right on the display, wherein a rightmost point represents a location of the time domain reflectometer; and d. from right to left on the display, wherein a rightmost point represents a location of the time domain reflectometer.

22. The method of claim 19, further comprising adjusting a location of at least one of the at least three reflection waves in a predetermined direction to correlate the at least two reflection waves.

23. The method of claim 19, wherein modifying one or more of the at least three reflection waves by employing wave shifting signal processing, further comprising at least one of the following:

a. employing wave reversal signal processing;

b. employing multi-cursor signal processing;

c. employing segmented velocity of propagation signal processing; and d. employing wet cable calculation processing.

24. The method of claim 23, wherein employing segmented velocity of propagation signal processing further comprises:

a. defining two or more segments of one or more of the at least three reflection waves;

b. determining a velocity of propagation adjustment for each of the three or more segments; and c. displaying each of the two or more segments of the one or more of the at least three reflection waves using the determined velocity of propagation adjustment for each of the three or more segments to modify a horizontal axis of a display.

25. The method of claim 23, wherein employing multi-cursor signal processing further comprises:

a. assigning three or more cursors to the at least three reflection waves; and b. calculating a distance between any two or more of the three or more cursors.

26. The method of claim 23, wherein employing a wet-calculation processing step includes the equation $Lw=Vw \times \{[L-(Dt \times Vd))]/(VOPw-VOPd)\}$.

27. A computer-readable medium having computer-executable instructions for performing the method recited in any one of claims 19–26.

28. A computer system having a processor, a memory, and an environment, the computer system operable for performing the method recited in any one of claims 19–26.

29. A method for assimilating data using a time domain reflectometer, the method comprising:

a. recording into memory at least three reflection waves of a signal propagated from a time domain reflectometer onto conductors;

b. modifying at least one of the at Least three reflection waves in at least one of the following ways:
  i. employing wave reversal signal processing;
  ii. employing wave shifting signal processing;
  iii. employing multi-cursor signal processing;
  iv. employing segmented velocity of propagation signal processing; and
  v. employing wet-cable calculation processing;

c. displaying the at least three reflection waves on a display of a time domain reflectometer; and d. simultaneously comparing the at least three reflection waves to locate anomalies.

30. A computer-readable medium having computer-executable instructions for performing the method recited in claim 29.

31. A computer system having a processor, a memory, and an environment, the computer system operable for performing the method recited in claim 29.

32. A method for assimilating data using a time domain reflectometer, the method comprising:

a. recording into memory at least three reflection waves of a signal propagated from a time domain reflectometer onto one or more conductors;

b. modifying at least one of the at least three reflection waves in at least one of following ways:
  i. employing wave reversal signal processing;
  ii. employing wave shifting signal processing;
  iii. employing multi-cursor signal processing;
  iv. employing segmented velocity of propagation signal processing; and
  v. employing wet-cable calculation processing;

c. simultaneously displaying the at least three reflection waves on a display of a time domain reflectometer; and d. comparing the at least three reflection waves to locate anomalies.

33. A computer-readable medium having computer-executable instructions for performing the method recited in claim 32.

34. A computer system having a processor, a memory, and an environment, the computer system operable for performing the method recited in claim 32.

* * * * *